United States Patent [19]
Saito et al.

[11] Patent Number: 5,672,906
[45] Date of Patent: Sep. 30, 1997

[54] SEMICONDUCTOR DEVICE HAVING DEFECTS OF DEEP LEVEL GENERATED BY ELECTRON BEAM IRRADIATION IN A SEMICONDUCTOR SUBSTRATE

[75] Inventors: Yutaka Saito; Takao Akiba; Koju Nonaka; Masaaki Kamiya; Hitomi Watanabe, all of Tokyo, Japan

[73] Assignee: Seiko Instruments Inc., Japan

[21] Appl. No.: 588,395

[22] Filed: Jan. 18, 1996

Related U.S. Application Data

[62] Division of Ser. No. 81,969, Jun. 24, 1993.

[30] Foreign Application Priority Data

Jun. 25, 1992 [JP] Japan ................... 4-167076

[51] Int. Cl.⁶ ...................................... H01L 29/30
[52] U.S. Cl. .................. 257/617; 257/611; 257/590; 257/369; 257/431
[58] Field of Search .................. 257/617, 611, 257/369, 431, 590

Primary Examiner—Mark V. Prenty
Attorney, Agent, or Firm—Adams & Wilks

[57] ABSTRACT

The present invention is provided for improving latch-up resistance in a semiconductor integrated circuit device employing CMOS structure, for preventing the photoelectric carriers from getting into the sensors and improving the afterimage characteristic in a semiconductor image sensor device, and for impurity the switching characteristic in a semiconductor device having bipolar element. An electron beam of over 2 MeV and $1E15/cm^2$ is irradiated to a monocrystal silicon semiconductor region in a substrate and then annealing is performed at a high temperature of over 200° C. As a result, at 150 K., a shallow level traps of which the activation energy from a valence band EV is under 0.1 eV and which is produced at the concentration of about $1.2–1.7E15/cm^3$, and a deep level traps of which the activation energy is 0.28–0.32 eV and which is produced at the concentration of about $1.6–2.0E13/cm^3$ are obtained. Then a semiconductor substrate having both the level traps stated above as recombination centers in a band gap of silicon is obtained. The chip size of this semiconductor substrate doesn't increase, and furthermore the cost of it is low as an epi wafer is not used. As well, it is possible to manufacture a semiconductor integrated circuit device just before or just after a process step of evaluating the electrical characteristic of a semiconductor integrated circuit device.

5 Claims, 16 Drawing Sheets

FIG. 3
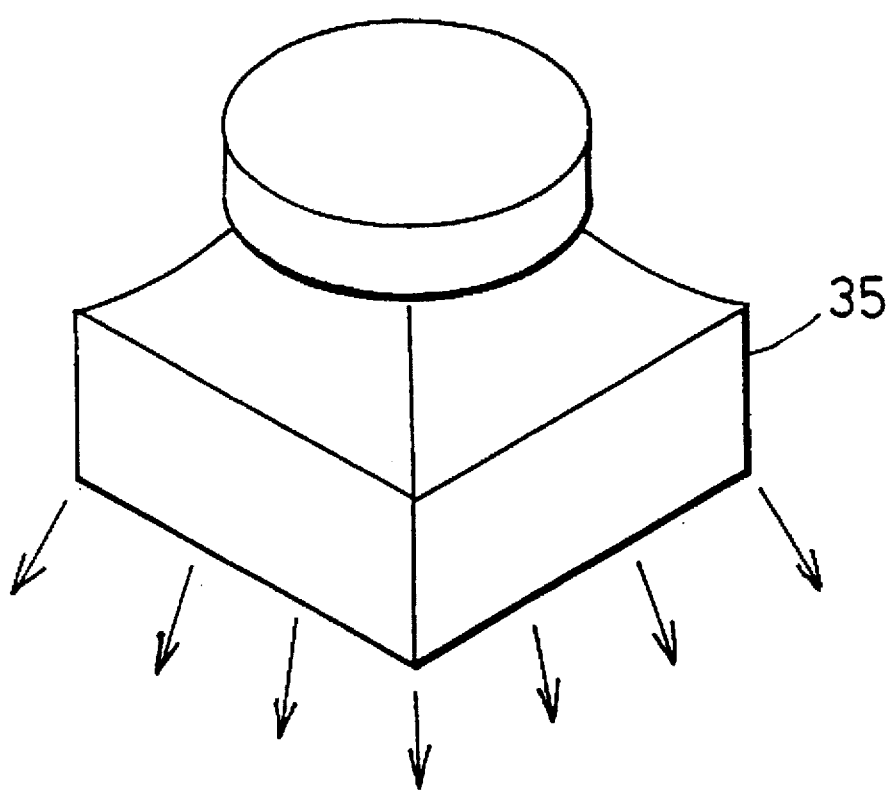
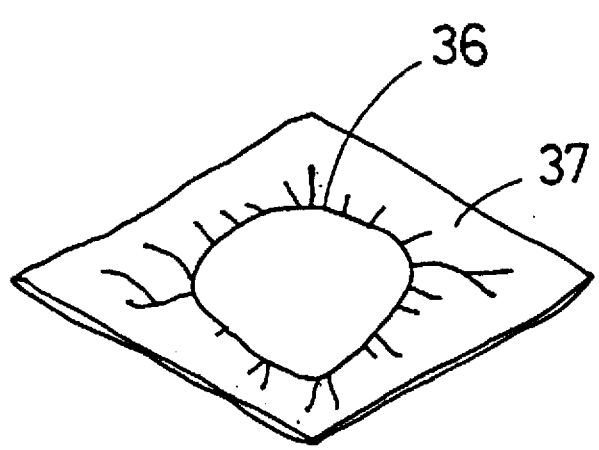

SEMICONDUCTOR DEVICE HAVING DEFECTS OF DEEP LEVEL GENERATED BY ELECTRON BEAM IRRADIATION IN A SEMICONDUCTOR SUBSTRATE

This is a division of application Ser. No. 08/081,969 filed Jun. 24, 1993.

BACKGROUND OF THE INVENTION

The present invention relates to a structure and a manufacturing method of a monocrystal silicon semiconductor substrate and a semiconductor device and a manufacturing method of it. Specifically, as for the semiconductor device, the present invention relates to a semiconductor integrated circuit device employing CMOS structure, a semiconductor image sensor device, and a semiconductor device having a bipolar element.

Prior art will be explained below with an illustration of latch-up phenomenon in a semiconductor integrated circuit device employed CMOS structure. FIG. 18 is a schematic cross section showing a conventional semiconductor integrated circuit device employing CMOS structure. This is a general CMOS-type semiconductor integrated circuit device having a N-type well 1015 of N-type impurity concentration about 3E16 atms/cm$^3$ which is provided on a P-type silicon semiconductor substrate 1016 of P-type impurity concentration about 7E14 atms/cm$^3$. It constitutes a N-channel MOS transistor 1010 and a P-channel MOS transistor 1009.

The P-channel MOS transistor 1009 constitutes equivalently a PNP bipolar transistor Tr1 1001. The N-channel MOS transistor 1010 constitutes equivalently a NPN bipolar transistor Tr2 1003. The PNP bipolar transistor 1001 the NPN bipolar transistor Tr2 1003 include an effective resistivity Rn 1002 and Rp 1004 respectively between a base and a emitter. Then they from an equivalent circuit as shown in FIG. 19. When a surge current 1021 is sent to an input terminal 1020 to a certain amount, a carrier 1022 generated by the surge current diffuses. Furthermore when the carrier actuates either the NPN transistor or the PNP transistor, a collector current of the actuated transistor, as seen from FIG. 19, functions as a base current of the other transistor and so actuates the other transistor. In this case, the current is supplied continuously to the base of the transistor actuated earlier and so the current keeps on flowing between a power supply electrode Vcc 1005 and a power supply electrode Vss 1006 even after the surge current, which has been a first trigger, ceases. Then the semiconductor integrated circuit device malfunctions. Furthermore, in the worst case, its wiring pattern fuses. This phenomenon is called latch-up. Usually, a semiconductor integrated circuit device must not cause latch-up to the surge current and noises to some electrical value. This value is called latch-up resistance. Then the measures taken to raise the latch-up resistance are as followings: One of them is to lower the effective resistivity Rp 1004 and Rn 1002 shown in Figures. When resistivity lowers, it is depressed that an electric potential in a base region rises by carriers brought by the surge current and so each transistor is not turned on easily. As a result, latch-up resistance improves. Means for lowering resistivity are to raise impurity concentration of the substrate 1016, to raise impurity concentration of the well 1015, and to use an epi wafer. (As shown in FIG. 18, it comprises a P$^+$-type substrate 1023 of about 1E18–1E20 atms/cm$^3$ concentration as a semiconductor substrate and a P$^-$-type layer of about several μm—several tens μm concentration which is performed epitaxial growth on the surface of the P$^+$-type substrate and which corresponds to the P$^-$-type semiconductor substrate 1016 in FIG. 18.) Another is to lower hFE (direct current amplification factor) of parasitic bipolar transistors stated above. If hEF is low and the quantity of base current is not changed, the quantity of collector current becomes small. In order to lower hFE, there are some ways such as to raise impurity concentration of the substrate 1016 as stated above, to raise impurity concentration of the well 1015, and to widen a size L1 1007 and a size L2 1008 shown in FIG. 18, it means, to widen a base-width, WB, to lower hEF. Another is to depress the quantity of carrier diffused by the surge current. It is to extract carrier by providing a well 1018 of N$^-$-type layer connected to the Vcc 1005 between the input terminal 1020 and CMOS portion (It comprises the N-channel MOS transistor 1010 and the P-channel M0S transistor 1009, in this case.) as shown in FIG. 19. This N-well connected to the Vcc is called guard ring. Using an epi wafer is similarly effective to depress the quantity of diffused carrier. That's because carrier lifetime in a P$^+$-type substrate 1023 is shorter than that in a P$^-$-type region by several digits and so carrier is hard to reach the CMOS portion. In FIG. 18, a region 1012 is a P+-type diffusion region, regions 1013, 1014, 1017, and 1018 are N$^+$-type impurity regions. 1011 is a gate electrode of the MOS transistor.

The structure of a conventional semiconductor device is stated above and the problems of it to be solved will be mentioned below.

A first problem is as follows; When the substrate impurity concentration and the well impurity concentration are increased, channel conductance of a MOS transistor is declined and then necessary current value, that means, plane size of a transistor to get an action speed becomes large, so the chip size (plane size of a semiconductor integrated circuit device) is increased. That invites rising costs. Besides, VTH (threshold voltage) of a MOS transistor, that is acting voltage as a semiconductor integrated circuit device rises and the increase of both VTH and a leakage current cannot be prevented at the same time. The durability of a semiconductor device declines because of hot electrons. Therefore the increase of the concentrations is limited to some extent.

A second problem is that enlarging the sizes L1 and L2 shown in FIG. 18 and providing a guard ring make the chip size larger.

A third problem is that using an epi wafer highly rises the manufacturing cost of a semiconductor substrate. The cost will be about a few times to ten times as high as the cost of a substrate having no epi wafer.

SUMMARY OF THE INVENTION

The object of the present invention is to provide a CMOS semiconductor device having large latch-up resistance.

Another object of the present invention is to provide a semiconductor image sensor device which acquires high resolution when interaction of photoelectric carriers between sensors is hindered.

Another object is to provide a semiconductor device having a bipolar transistor which is superior in switching characteristic.

Another object is to provide a silicon semiconductor substrate for a semiconductor device containing controlled crystal defects (traps) of the shallow level and the deep level.

Another object is to provide a manufacturing method with which the characteristics of a semiconductor device can be easily controlled after the semiconductor device is completed.

In order to achieve the above objects, the present invention employs the following means.

1. A semiconductor substrate having the shallow level traps and the deep level traps which function as recombination centers in a band gap of silicon is obtained. The shallow level traps have the activation energy from a valence band EV of under 0.1 eV at 150 K. and their concentration is about 1.2–1.7 E15/cm$^3$. On the other hand, the deep level traps have the activation energy of about 0.28–0.32 eV at 150 K. and their concentration is about 1.6–2.0 E13/cm$^3$. The defects traps of deep level have the maximum value in DLTS signal at 150 K.

2. A semiconductor substrate stated in 1 is manufactured in a method which includes a process of irradiating an electron beam of over 2 MeV at a density of over 1 E14/cm$^2$.

3. A semiconductor substrate stated in 1 is manufactured in a method which includes a process of irradiating an electron beam of over 2 MeV at a density of over 1 E14/cm$^2$ to only a specified part.

4. A semiconductor substrate stated in 2 and 3 is manufactured in a method which includes a process of irradiating an electron beam in a container which is airtight and from which the air has been pumped out at a vacuum of over 1 E-2 Torr (high degree of vacuum).

5. A semiconductor substrate stated in 2–4 is manufactured in a method which includes a process of annealing at over 200 ° C.

6. A semiconductor device having the shallow level traps and the deep level traps which function as recombination centers in a band gap of silicon is obtained. The shallow level traps have the activation energy from a valence band EV of under 0.1 eV at about 150 K (kelvin temperature) and their concentration is about 1.2–1.7 E15/cm$^3$. The deep level traps have the activation energy of about 0.28–0.32 eV at about 150 K. and their concentration is about 1.6–2.0 E13/cm$^3$.

7. A semiconductor device a part of which has the shallow levels and the deep levels functioning as recombination centers in a band gap of silicon is obtained. The shallow level traps have the activation energy from a valence band EV of under 0.1 eV at about 150 K. and their concentration is about 1.2–1.7 E15/cm$^3$. The deep level traps have the activation energy of about 0.28–0.32 eV at about 150 K. and their concentration is about 1.6–2.0 E13/cm$^3$.

8. A semiconductor device stated in 6 and 7 is manufactured in a method which includes a process of irradiating an electron beam of over 2 MeV at a density of over 1 E14/cm$^2$.

9. A semiconductor device stated in 6 and 7 is manufactured in a method which includes a process of irradiating an electron beam of over 2 MeV at a density of over 1 E14/cm$^2$ to a specified part.

10. A semiconductor device stated in 6 and 7 is manufactured in a method which includes a process of irradiating an electron beam in a container which is airtight and from which the air has been pumped out at a vacuum of over 1 E-2 Torr (high degree of a vacuum).

11. A semiconductor device stated in 6 and 7 is manufactured in a method which includes a process of annealing at over 200 ° C.

12. A semiconductor device stated in 6 and 7 which employs CMOS structure comprising a P-type insulating gate field effect transistor and a N-type insulating gate field effect transistor.

13. A semiconductor device stated in 6 and 7 which is a semiconductor image sensor device wherein a plurality of photo sensors are provided at regular intervals on a semiconductor region is obtained.

14. A semiconductor device stated in 6 and 7 which includes a bipolar element comprising an emitter region and a collector region of reverse conducting type and contiguous to a base region having crystal defects of deep level is obtained.

15. A semiconductor device stated in 6 and 7 which employs BiCMOS structure comprising a CMOS circuit and a bipolar transistor.

16. A manufacturing method of a semiconductor device stated in 8–11 which employs CMOS structure is used. The manufacturing method of a semiconductor device comprises the following process steps of; forming a pn-type junction by introducing an impurity of a second conducting type to a semiconductor region of a first conducting type, providing electric electrodes to each of the P-type semiconductor region and the N-type semiconductor region, forming a passivation film for protecting a semiconductor device from the outside, and irradiating an electron beam.

17. A manufacturing method of a semiconductor device stated 8–11 which is a semiconductor image sensor device is employed.

18. A manufacturing method of a semiconductor device stated in 8–11 and including a bipolar element is employed.

19. A manufacturing method of a semiconductor device stated in 8–11 and employing BiCMOS structure is used.

The above-stated means bring the following effects.

Thanks to the means explained in 1, 6, 7, 9, 12–19, minority—carrier lifetime declines and furthermore latchup resistance improves.

Thanks to the means explained in 2, 3, 8, the level traps are formed suitably in a silicon substrate.

Thanks to the means explained in 4, 10, 12–19, desired latch-up resistance is achieved and furthermore a leakage current of pn-type junction and the characteristics of a MOS transistor are well restored.

Thanks to the means 5 and 10, various bad influences caused by oxygen which entered a silicon wafer (knock-on) are prevented.

BRIEF DESCRIPTION OF THE DRAWINGS

FIG. 3 is a schematic view showing electron beam irradiation which is a manufacturing method of a semiconductor integrated circuit device which is a first embodiment of a semiconductor device disclosed in the present invention;

DESCRIPTION OF THE PREFERRED EMBODIMENTS

A desirable embodiment of the present invention will be explained below in reference to the drawings.

Figure 1:
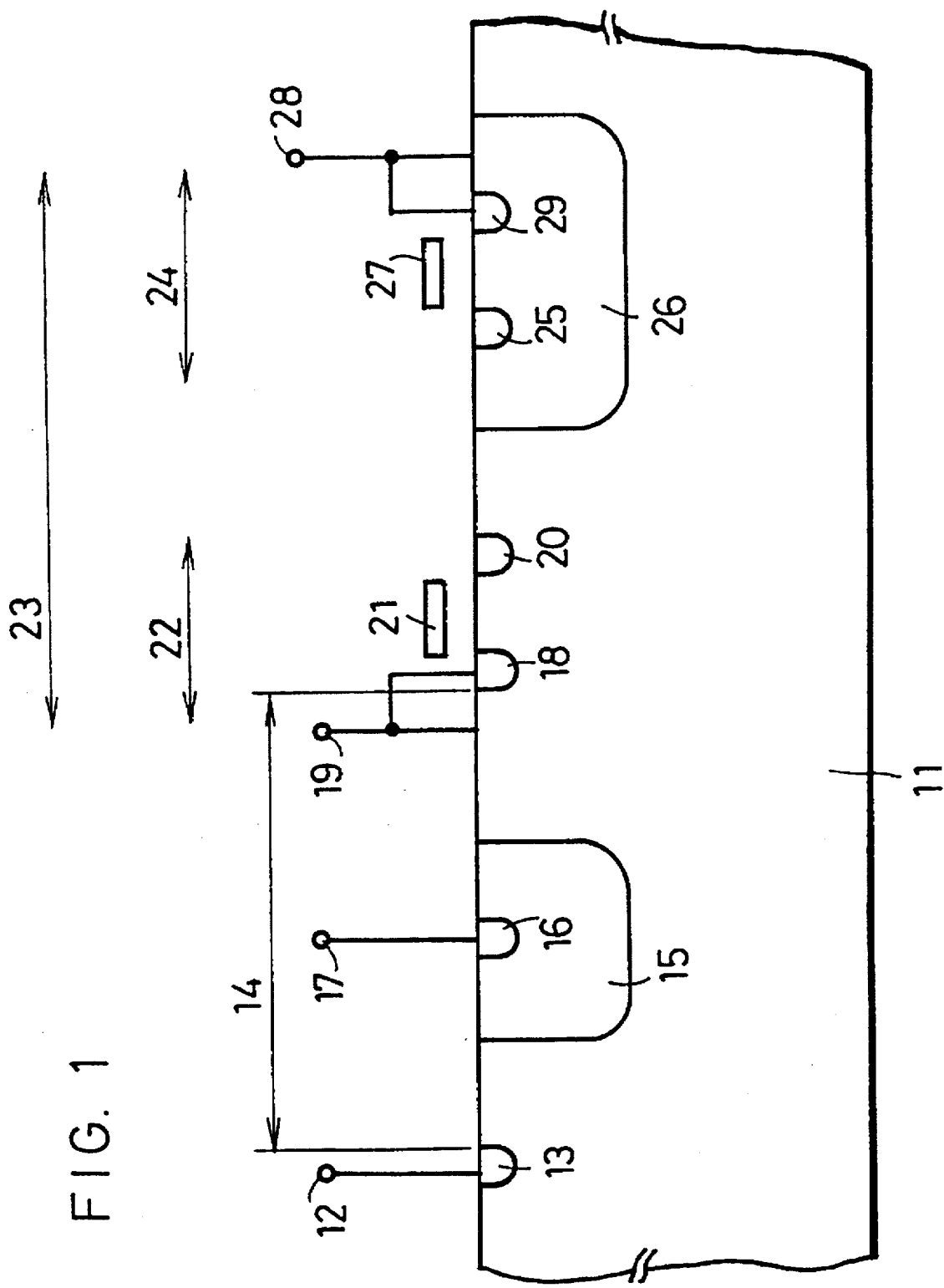
FIG. 1 is a schematic cross section showing a part of a semiconductor integrated circuit device which is a first embodiment of a semiconductor device disclosed in the present invention.
Figure 18:
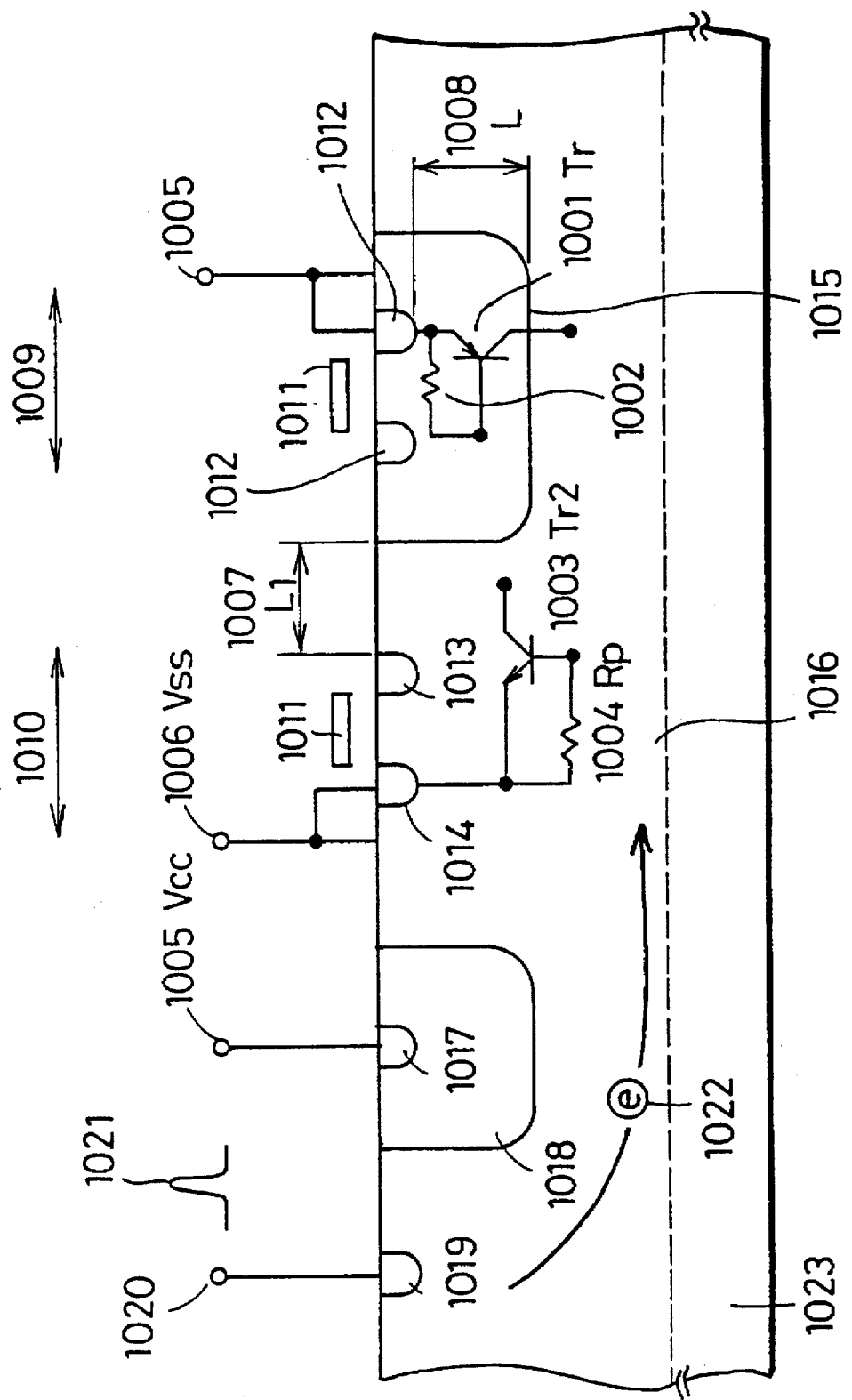
FIG. 18 is a schematic cross section showing a semiconductor integrated circuit device employing conventional CMOS structure.
Figure 19:
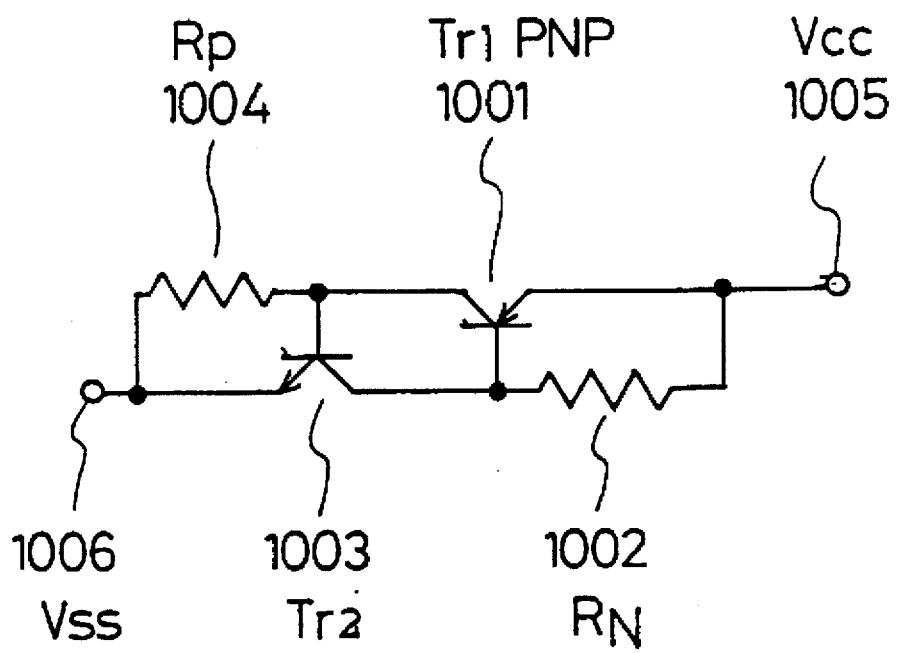
FIG. 19 is a schematic block diagram showing an equivalent circuit of a semiconductor integrated circuit device employing conventional CMOS structure.

FIG. 1 is a schematic cross section showing a part of a semiconductor integrated circuit device which is a first embodiment of a semiconductor device disclosed in the present invention. Its outward is similar to a conventional semiconductor device shown in FIG. 18. It is a schematic drawing and so an intermediate insulating layer, Al wiring, a surface protecting film (a passivation film) and so on are omitted. A CMOS circuit 23 comprises a N-channel MOS transistor 22 and a P-channel MOS transistor 24. 26 is a N-type well. 25 and 29 are P$^+$-type impurity regions. 13, 16, 18, and 20 are N$^+$-type impurity regions. 21 and 27 are gate electrodes of the MOS transistor.

Figure 2:
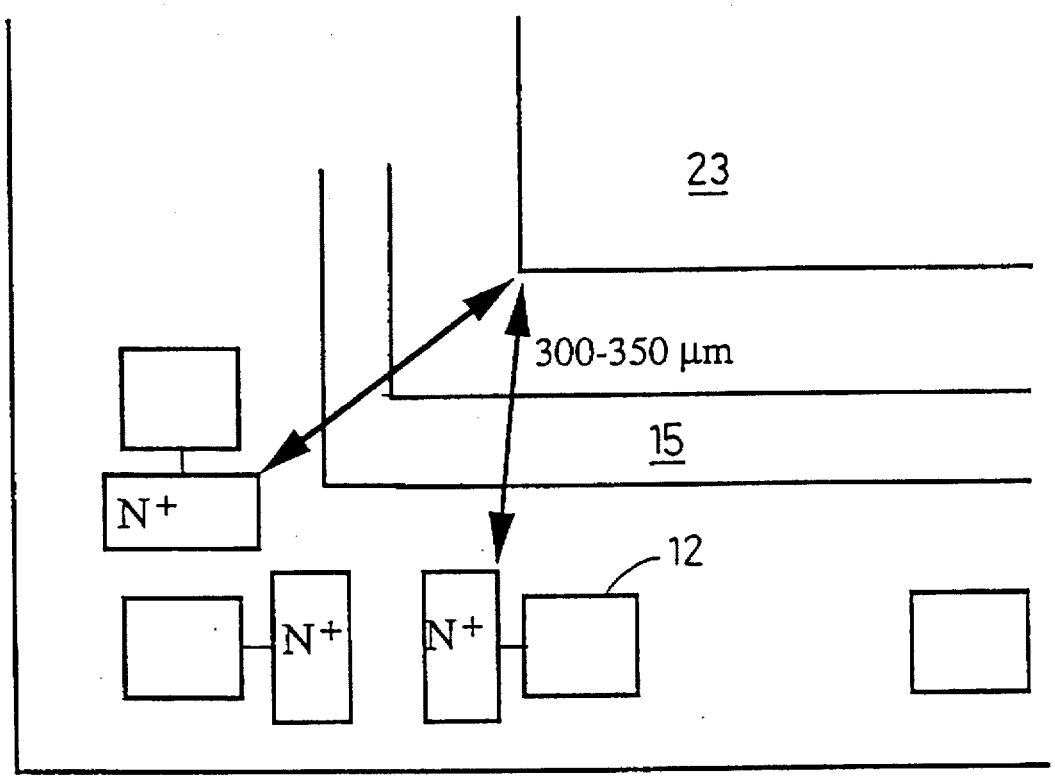
FIG. 2 is a schematic plan view showing another part of a semiconductor integrated circuit device which is a first embodiment of a semiconductor device disclosed in the present invention.

FIG. 2 is a schematic plan view showing a part of a semiconductor integrated circuit device which is a first embodiment of a semiconductor device disclosed in the present invention. A semiconductor device applied to this embodiment is 256 K bit SRAM employing CMOS-type circuit structure of about 4.4×13.0 mm in area (chip size). Its design rule is 1.0 µm rule. A substrate 11 is of P$^-$-type and 20–30 Ω.cm in concentration. Usually, an epi wafer is applied to the substrate 11. On the other hand, if an epi wafer is not used, even the shortest distance from an input terminal 12 to the CMOS portion 23 with a guard ring 15 in between in 300 µm and the latch-up resistance is only several dozens mA. As stated later, the requirements for a semiconductor integrated circuit device are that the least latch-up resistance by current injection method is 100 mA and that Vcc is 5.5 V. In this embodiment, an electron beam is irradiated to the semiconductor integrated circuit device which is perfection as an wafer finished passivation.

FIG. 3 is a schematic diagram showing irradiation of an electron beam which is a manufacturing method of a semiconductor integrated circuit device which is the first embodiment of a semiconductor device disclosed in the present invention. A wafer 36 is put in a polyethylene bag 37. Air in this bag is pumped out so as to be vacuum at high degree of vacuum over 1E–2 Torr. Furthermore this bag is airtight The wafer is placed about one meter away from an irradiation nozzle 35 and an electron beam from a high energy electron beam generator is irradiated to the wafer in the air. Unless the bag containing the wafer is airtight to the extent stated above, that means, if the wafer is exposed to air, irradiation causes various bad influences because oxygen and so on are injected (knocking-on) to the silicon wafer. It doesn't matter whether the electron ray is irradiated to the front or the back of the silicon wafer. In this embodiment, a neutron flux and r-rays are also irradiated for comparison, which are explained together.

Figure 4:
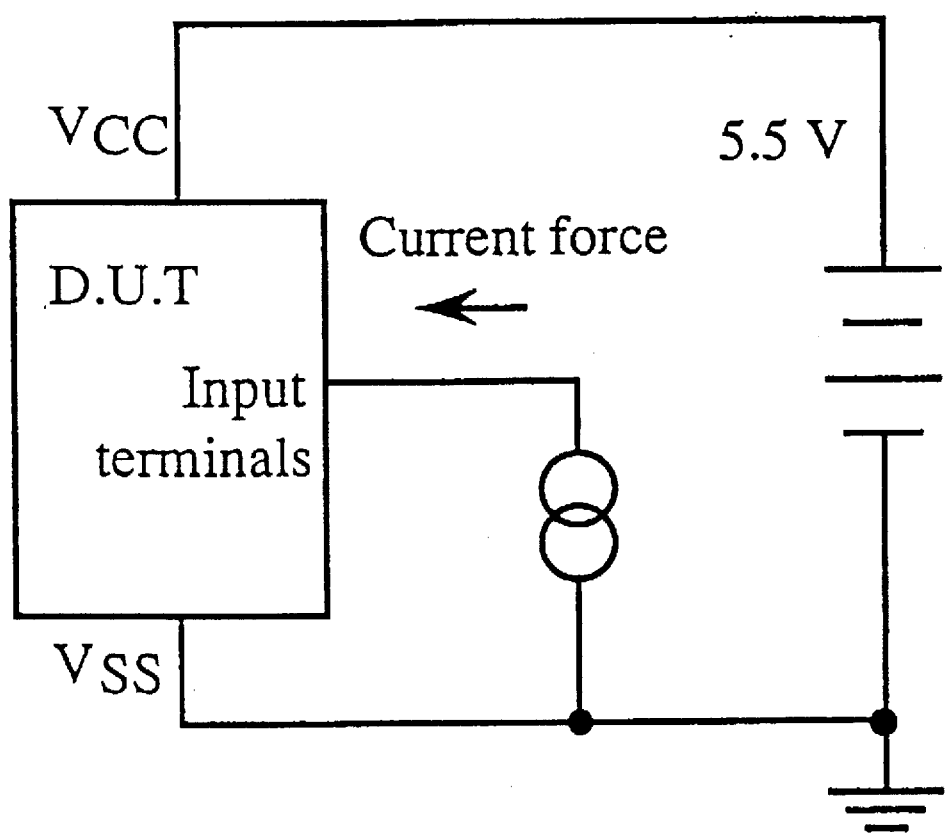
FIG. 4 is a schematic block diagram showing a circuit which is a general measuring method of latch-up resistance of a semiconductor integrated circuit device.

FIG. 4 is a schematic block diagram showing a circuit which is a general way to measure latch-up resistance. A semiconductor integrated circuit device to be measured (D.U.T, which is short for Device Under Test) in injected 5.5 V to its Vcc and then current is injected to each of input terminals. The current value at which the semiconductor integrated circuit device starts latch-up is latch-up resistance (IL).

Figure 5:
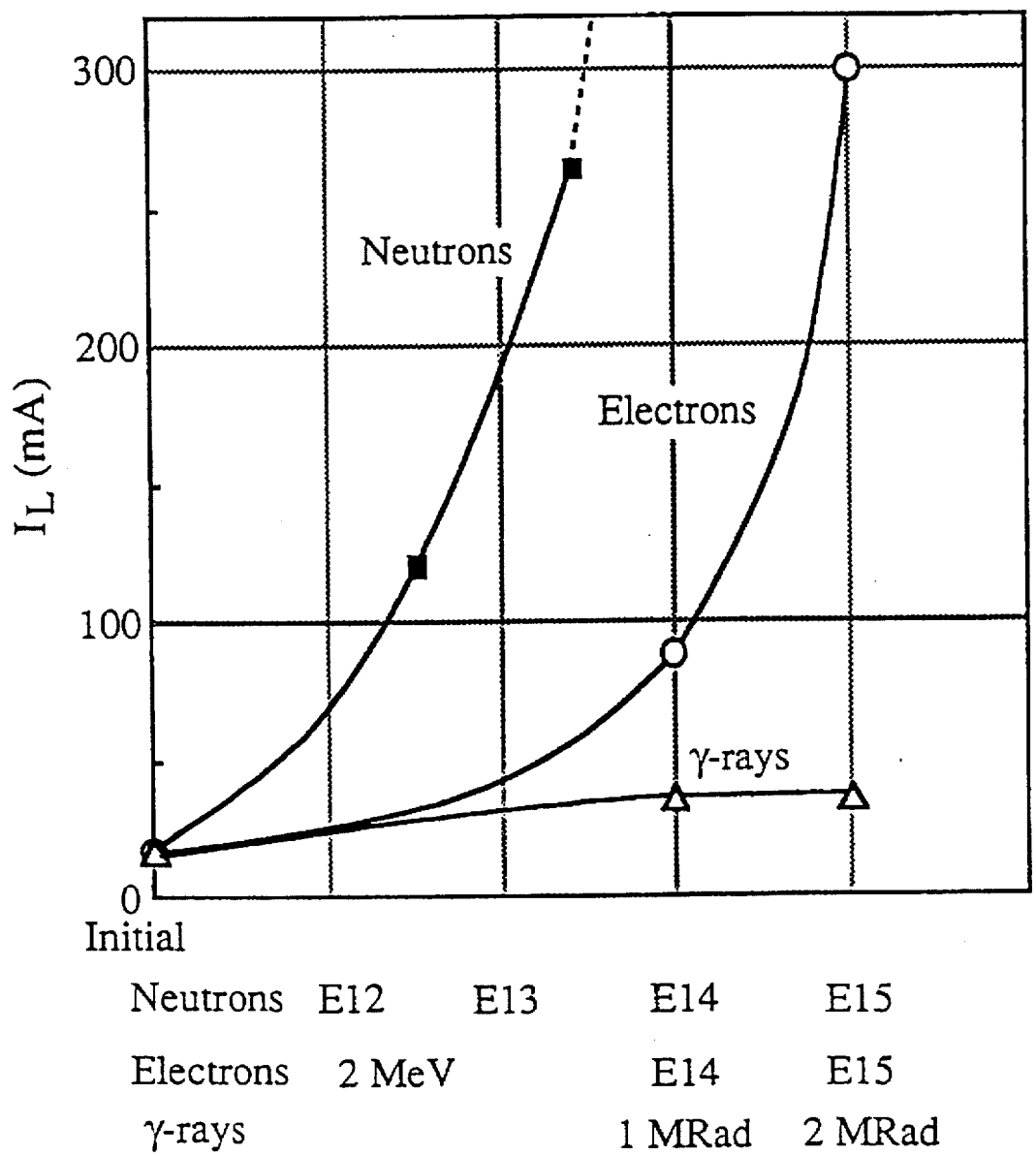
FIG. 5 is a graph showing a relation between IL after irradiation (As Exposed) and the quantity of irradiation.

FIG. 5 is a graph showing a relation between IL after irradiation and the quantity of irradiation. "Initial" means latch-up resistance before irradiation. It is observed that IL remarkably improves by irradiating an electron beam and a neutron flux. Irradiating r-rays improves IL very slightly. However, after irradiation, the semiconductor integrated circuit device (SRAM) does't work normally at all. That's because the value of a leakage current in pn-type junction and the value of VTH in a MOS transistor get excessively big. Then, if annealing (heat treatment in N2 atmosphere) is performed after irradiation, the wafer irradiated an electron beam restores the characteristics of leakage current in pn-type junction and that of a MOS transistor enough. At the same time IL declines a little, however it is not a trouble. Annealing also restores the characteristics of leakage current in pn-type junction and that of a MOS transistor in the wafer irradiated a neutron flux, however, it is insufficient. In the wafer irradiated r-rays, the characteristics of leakage current in pn-type junction and that of a MOS transistor are restored completely by annealing, however, IL reverts to the value previous to irradiation.

Figure 6:
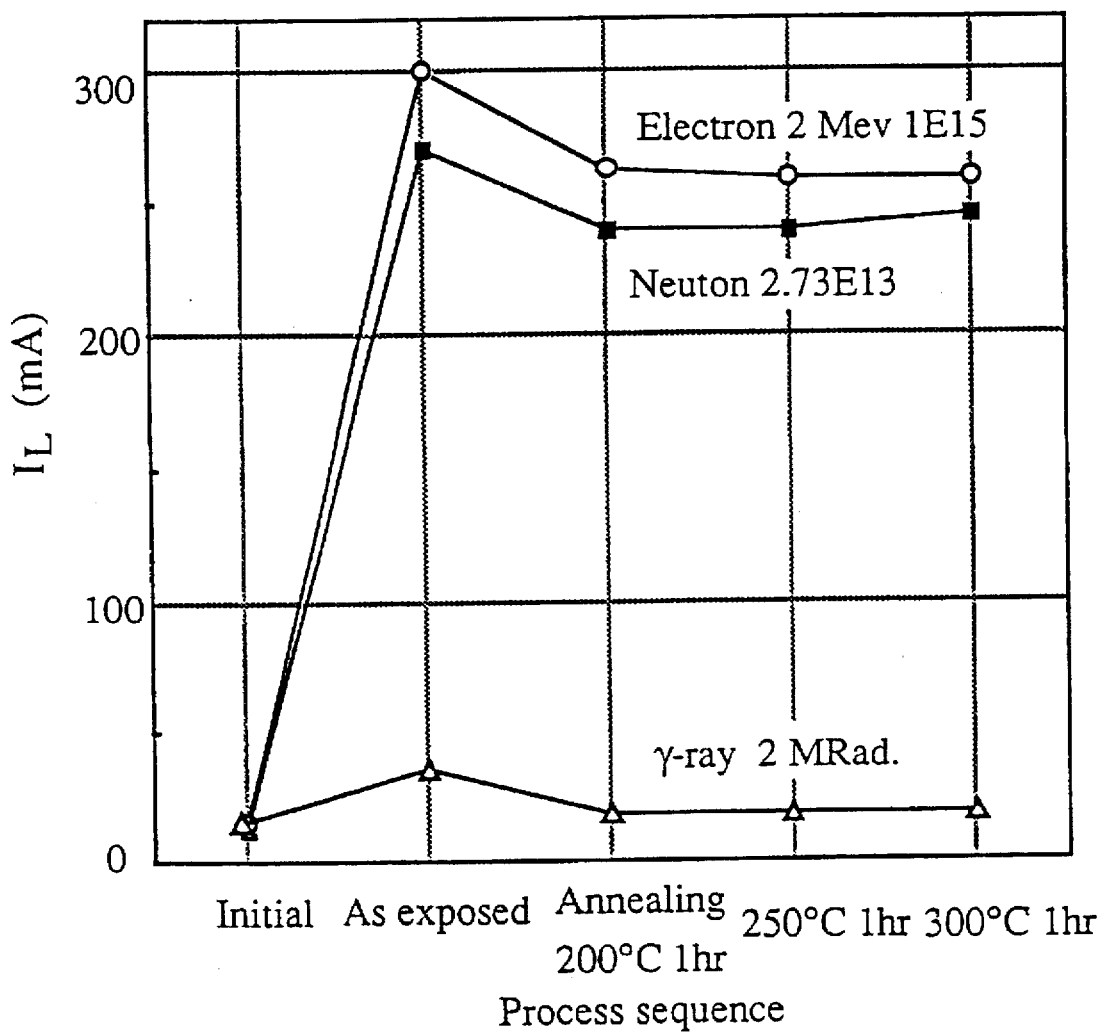
FIG. 6 is a graph showing a change of IL at irradiation and annealing.
Figure 7:
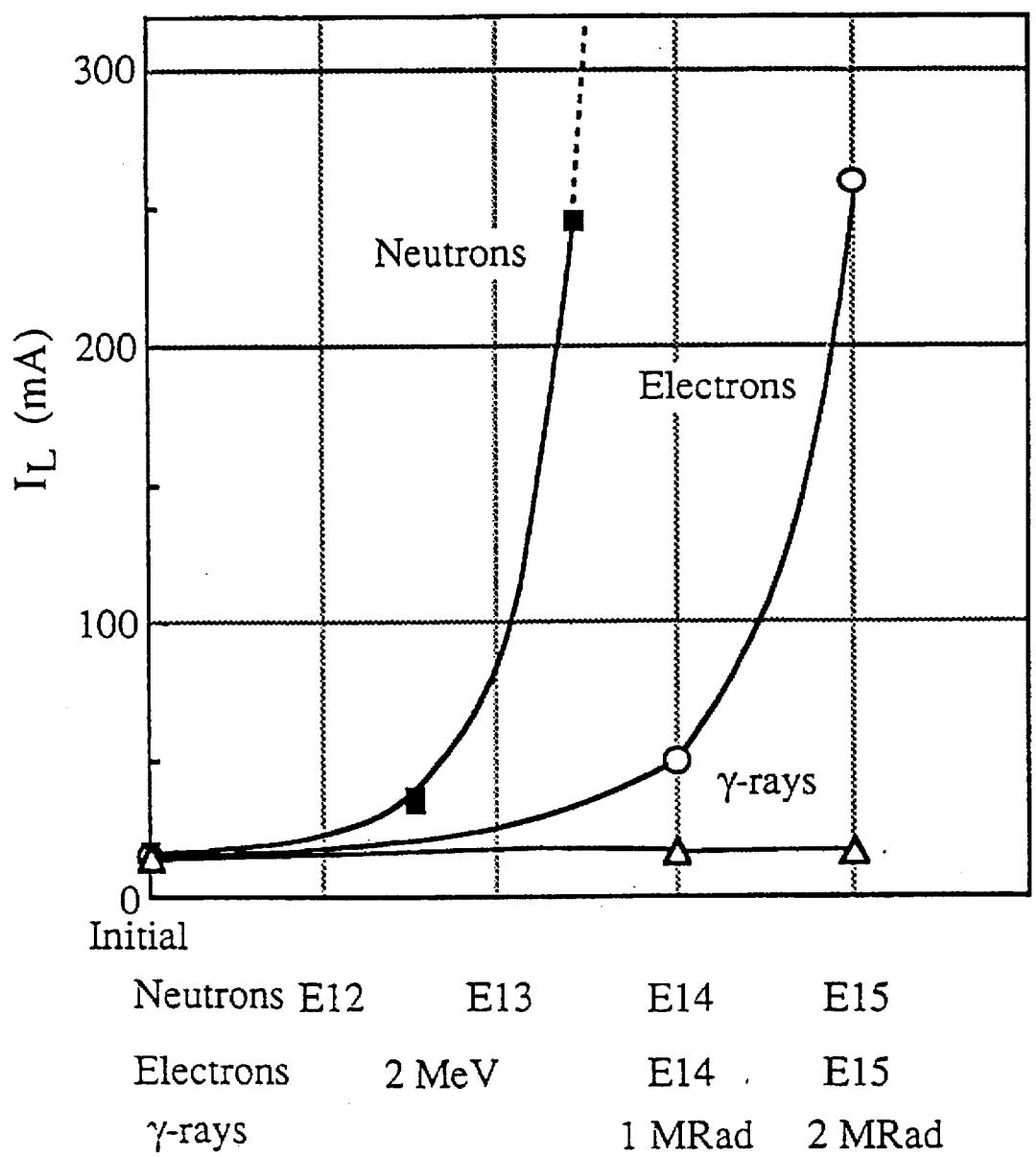
FIG. 7 is a graph showing a relation between IL after annealing and the quantity of irradiation.

FIG. 6 is a graph showing the change of the value of IL caused by irradiation and annealing. FIG. 7 is a graph showing a relation between IL after annealing and the quantity of irradiation. As seem from FIG. 7, the wafer irradiated an electron beam of over 2 MeV and over 1 E15/cm$^2$only obtains necessary IL, and furthermore restores normal function of a semiconductor integrated circuit device.

Figure 8:
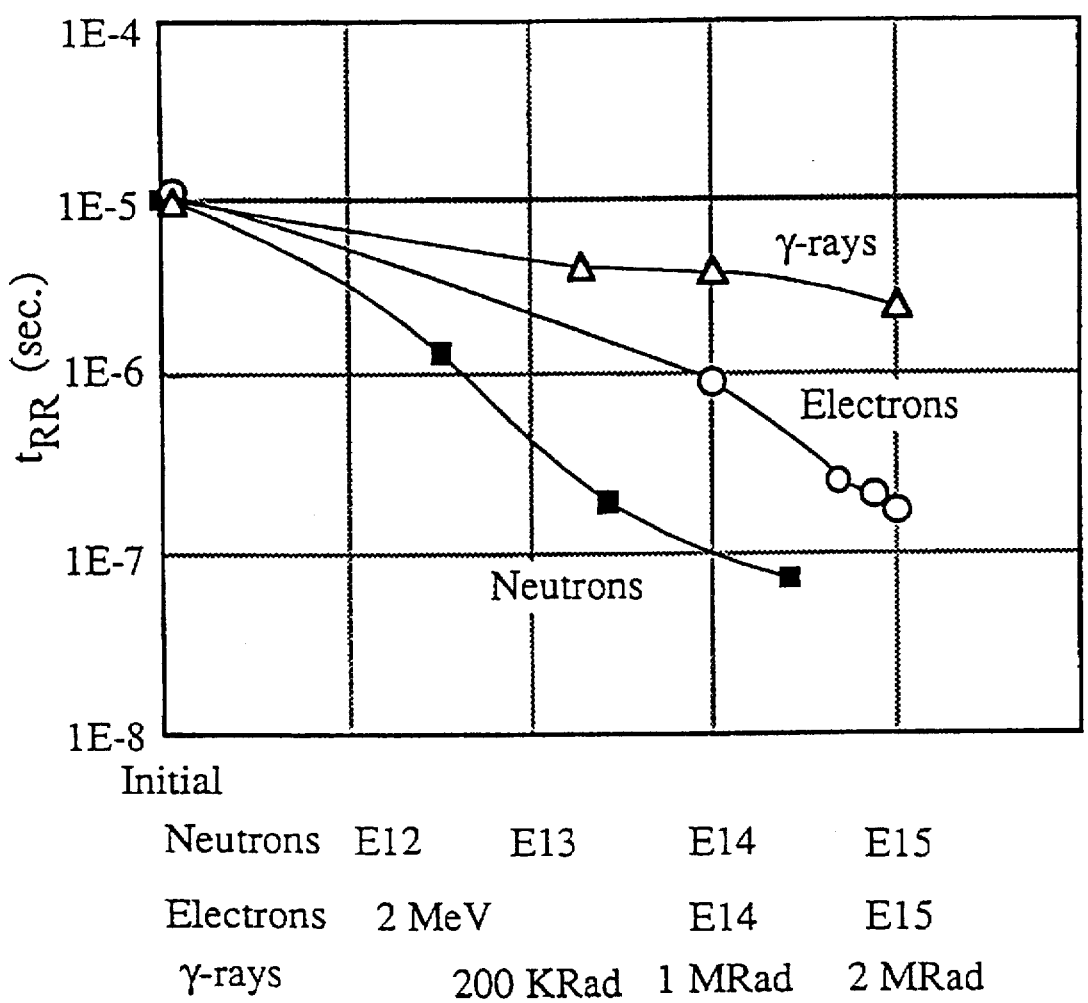
FIG. 8 is a graph showing a relation between tRR (recovery time of pn-type junction when electric current of 4 mA/mm$^2$ is sent at the forward direction) and the quantity of irradiation.

Then it will be explained below why IL can improve. FIG. 8 is a graph showing a relation between tRR (recovery time of pn-type junction to which current of 4 mA/mm2 is sent at the forward direction) and the quantity of irradiation. tRR shows directly minority carrier lifetime and it follows that improvement of IL in the present invention is brought by the decline of minority carrier lifetime. As stated above, even after annealing is performed, the wafer irradiated a neutron flux does not restore enough the function of a semiconductor integrated circuit device, though it has IL of the same value as that of the wafer irradiated an electron beam. That is to say, mainly, there are much leakage current in pn-type junction.

Figure 9:
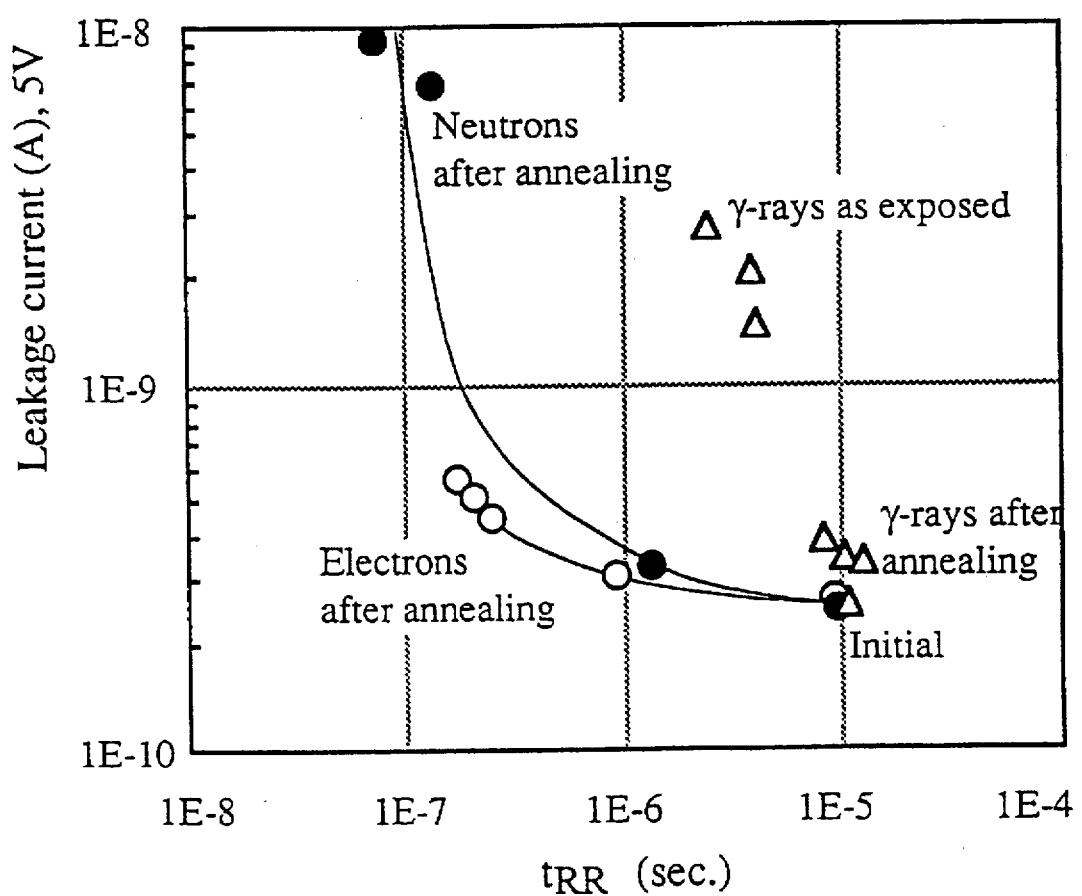
FIG. 9 is a graph showing a relation of each irradiation beam between a leakage current of pn-type junction after annealing and tRR (minority-carrier lifetime)

FIG. 9 is a graph showing a relation of each irradiation beam between a leakage current of pn-type junction after annealing and tRR (minority-carrier lifetime). It shows that a relation between a leakage current and a minority-carrier lifetime differs with beams. That means a position (level) of a recombination center formed in a band gap of silicon is different. Then a level of DLTS method [D.V. Lang, Appl. Phys. 45–7 (1974), 3014, 3023.] and that of ICTS method [H.Okushi and Y. Tokumura, Jpn. J. Appl. Phys. 19 (1980) L335.] are compared in a fixed quantity. Table 1 is a table showing measurement results of levels.

TABLE I

DLTS and ICTS measurement results.

| Temp. | | 60K | 80K | 150K (Electron) 140K (Neutron) | 200K |
|---|---|---|---|---|---|
| Electron | Ns | 1.5E15 | 1.5E15 | 1.5E15 | 1.6E15 |
| 2 MeV | Nd | 1.0E13 | 1.6E12 | 1.8E13 | 3.7E13 |
| 1E15 | ΔE | — | 0.18 eV | 0.29 eV | 0.37 eV |
| Neutron | Ns | 1.3E15 | 1.5E15 | 1.5E15 | 1.5E15 |
| 2.73 | Nd | 1.8E13 | 1.1E13 | 2.6E13 | 2.8E13 |
| E13 | ΔE | — | 0.13 eV | 0.21 eV | 0.36 eV |

Ns: Shallow level concentration ($cm^{-3}$)
Nd: Deep level concentration ($cm^{-3}$)
ΔE: Activation energy (Ev+)

Figure 10:
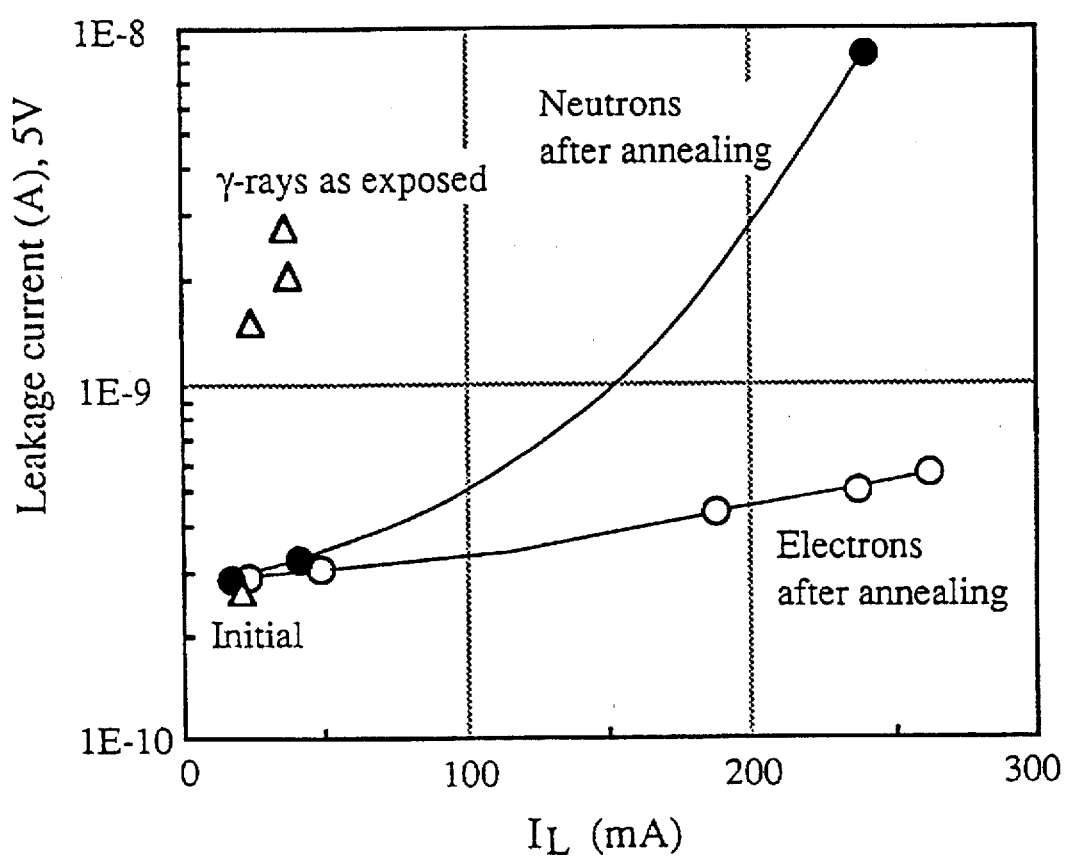
FIG. 10 is a graph showing a relation between a likeable current after annealing and IL.

However, there is few traps to be measured in a silicon wafer irradiated r-rays and also in a silicon wafer not irradiated, so not shown in the table. An obvious difference between an electron beam and a neutron flux is seen in a DLTS signal at around 150 K. (Kelvin temperature). The maximum value of a DLTS signal is at 150 K. in an electron beam and at 140 K. in a neutron flux. The temperature in which a neutron flux indicates the maximum value is similar to the temperature in which a DLTS signal from a wafer doped a heavy metal such as Au (gold) indicates the maximum value. When minority-carrier lifetime declines by doping a heavy metal, latch-up resistance is improved, but a leakage current is a large quantity and not improved. Therefore a defect level produced by electron beam irradiation indicates the maximum value of a DLTS signal at 150 K. Its activation energy from valence band Ev; ΔE is under 0.1 eV. This deep level is about 1.6–2.0 E13/$cm^3$ in concentration and is in a band gap of silicon. Furthermore this deep level functions as a recombination center and then helps to improve latch-up resistance. The shallow levels of which the activation energy is under 0.1 eV are at a concentration of 1.2–1.7 E15/$cm^3$. These deep level traps and shallow level traps are generated by lattice defects and function as recombination centers. These levels are different from impurity levels which are caused by introducing impurities. FIG. 10 is a graph showing a relation between a leakage current and IL after annealing. The distance from an input terminal to a CMOS portion of a semiconductor integrated circuit device employing CMOS structure is about 300 μm. The above-stated level is required for a semiconductor integrated circuit device which has a sufficient latch-up resistance without using an epi wafer, and furthermore of which a leakage current of pn-type junction is within the permissible level. A novel and excellent point of this present invention is here; Actually, trade-off between latch-up resistance, a leakage current, and other characteristics is not gained until the level in a silicon band gap is within the above-stated level. Therefore the above-stated level is formed (and the characteristics of a MOS transistor is also restored) by irradiating an electron beam of which the energy is over 2 MeV at a density of 1 e15/$cm^2$ and then annealing at 200°–300° C. for about one hour. This is very important. That's because the level can be formed by electron beam irradiation after a passivation process of the process sequence (a wafer process) of a semiconductor integrated circuit device as explained above. An electron beam can be irradiated after passivation film is formed as annealing is performed at a low temperature (200°–300° C.). Namely, if it is found that latch-up resistance is not enough because of an unexpected design mistake such as a size mistake at a testing process after a semiconductor integrated circuit device is completed, levels can be formed at that time. Of course, the levels can be provided in a wafer process, if so, the degree of freedom to provide conditions of annealing increases as a wafer can be heated over 500° C.

Although hidden from the view, when a semiconductor substrate is formed prior to a manufacturing process of a semiconductor integrated circuit device, the levels disclosed in the present invention, this embodiment can be provided or formed by electron beam irradiation. After a monocrystal silicon as semiconductor substrate is formed, the levels are formed by electron beam irradiation. Then a semiconductor device is formed with a manufacturing process of a semiconductor integrated circuit device. Electron beam irradiation can be done either before or after cutting in wafer-shape.

In the above explanation, an electron beam is irradiated to all the wafer. However, when an electron beam is irradiated in beam-state only to a necessary part (between an input terminal and a CMOS portion, for instance, as described above) of the wafer, the process time is shortened, the increase of a leakage current of pn-type junction is suppressed, and the deterioration of the characteristics of a MOS transistor is lessened. This is hidden from the view, however obviously useful.

Figure 11:
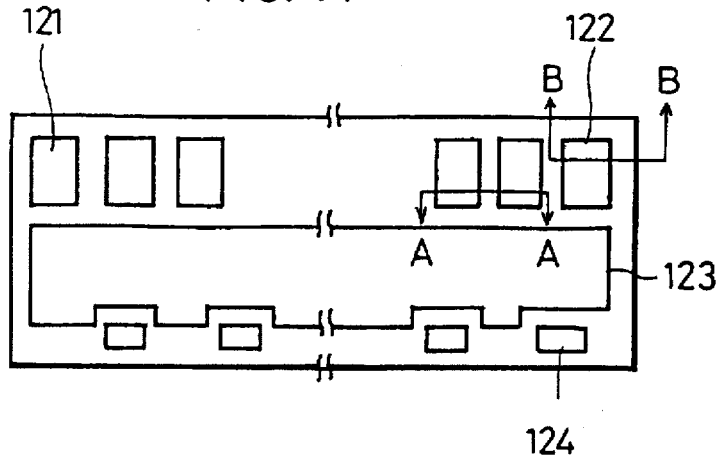
FIG. 11 is a schematic plan view showing a semiconductor integrated circuit device which is a second embodiment of a semiconductor device disclosed in the present invention.
Figure 12:
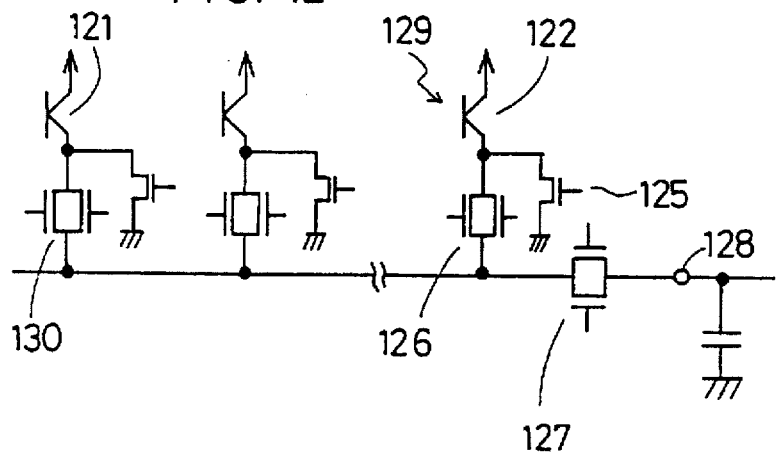
FIG. 12 is a schematic blockdiagram showing a circuit of a semiconductor image sensor device.

FIG. 11 is a schematic plan view showing a semiconductor integrated circuit device which is a second embodiment of a semiconductor device disclosed in the present invention. It is a semiconductor image sensor device, which is a semiconductor integrated circuit device for receiving a light, converting the light into an electric signal, and outputting the electric signal. Now, this embodiment is explained with an example of a semiconductor image sensor device of line-type used in a facsimile and so on. In this device, several photo transistors are placed side by side and the sensor output is controlled by a control circuit portion 123 and is outputted from a pad 124. FIG. 12 is a schematic block diagram showing a circuit of a semiconductor image sensor device. In this device, photo transistors 121–122 which are NPN transistors of a floating base receive a light 129, generate an electric charge, and store the electric charge. When the photo transistor is selected by transmission gates 126 and 130, it outputs a collector current which is hFE times the electric charge stored by photo transistor to an output terminal 128. A reset transistor 125 is provided in order to initialize the output of the photo transistor as a sensor. A transmission gate B 127 is provided so as to forward the output to the output terminal 128. A pitch to arrange photo transistors of 64 bit is 125 μm in a semiconductor image sensor device of 8 dot/mm.

Figure 13:
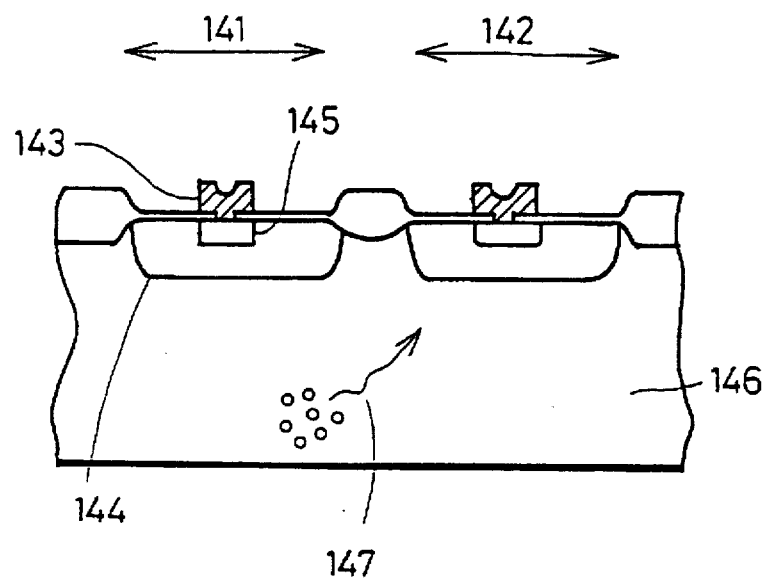
FIG. 13 is a schematic view showing a section of A–A' in FIG. 12.

FIG. 13 is a schematic diagram showing a section of A–A' shown in FIG. 11. FIG. 13 shows photo transistors placed side by side with each other. A photo transistor 141 comprises a emitter electrode 143, a $N^+$-type emitter region 145, $P^-$-type base region 144 and a $N^{31}$ -type collector region 146. Photoelectric carriers 147 occurred inside of the $N^-$ substrate 146 diffuse and scatter. Some photoelectric carriers are detected at the adjacent photo transistor 141, that means, signal separation between photo transistors (bits) is incompetent or the contrast is bad. By applying the present invention, without using an epi wafer, carriers diffusing to adjacent bits declines and good signal separation and good contrast is obtained. Some carriers remain even after the bit is selected and then cause the decline of the afterimage characteristic. However, the present invention can solve this problem well.

Figure 14:
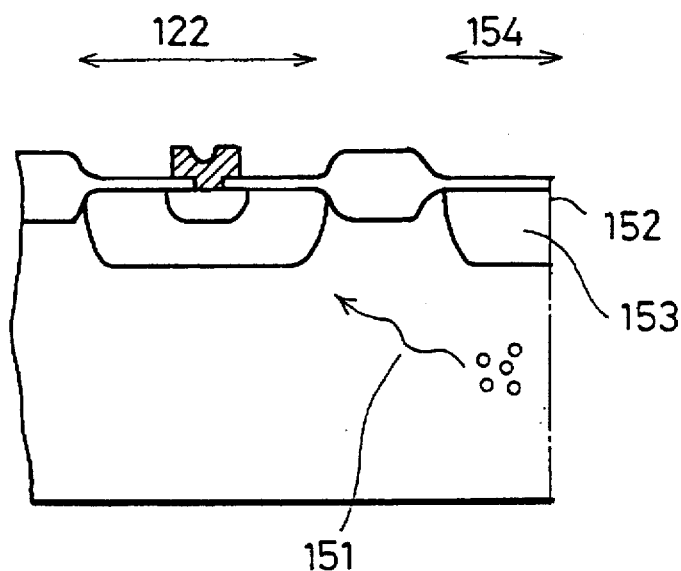
FIG. 14 is a schematic view showing a section of B–B' in FIG. 12.

FIG. 14 is a schematic view showing a section B–B' of FIG. 11. It shows a part of a semiconductor image sensor device which is adjacent to a chip edge 152. The chip edge 152 is a cross section cut with a dicing saw and the like. A region of $N^+$-type layer 153 is prepared as a cutting portion which is referred to as a scribe area 154. Before cutting, a wafer is inspected in order to make sure of the quality. Usually the semiconductor image sensor device detects signals by receiving the light, however, occasionally wrong signals appears from the bits located the edges of the sensors (the photo transistors 121–122). That's because the photoelectric carriers 151 generated by a light which entered the scribe area 154 diffuse and scatters. Then the present invention, without an epi wafer, prevents the carriers generated by a light which entered the scribe area from getting into the sensors. This embodiment is described with a line-type semiconductor image sensor device, but the present invention can be also applied to a capacity-coupling type semiconductor image sensor device, so-called CCD (charge-coupled device).

Figure 15:
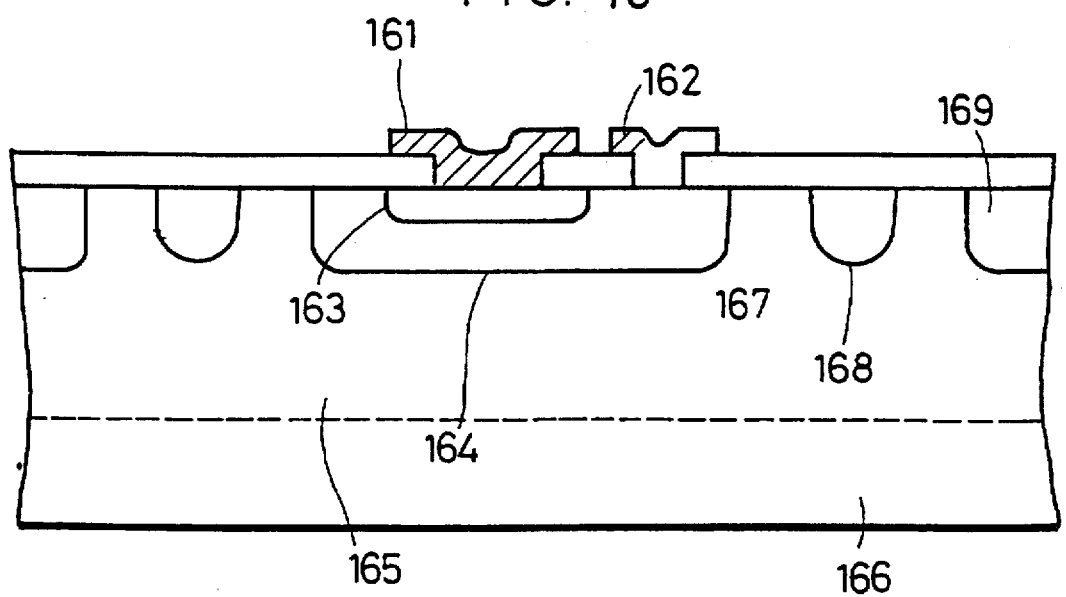
FIG. 15 is a schematic cross section showing a semiconductor device which is a third embodiment of a semiconductor device disclosed in the present invention.
Figure 16:
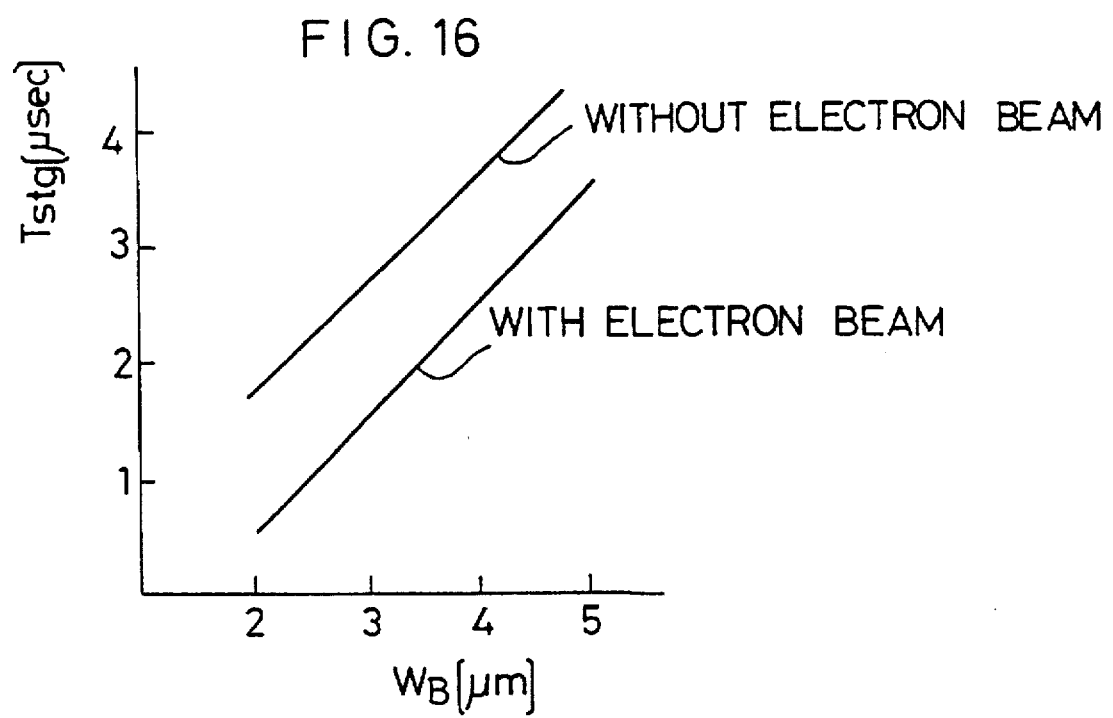
FIG. 16 is a graph showing a relation between WB and Tstg.

FIG. 15 is a schematic cross section showing a semiconductor device which is a third embodiment of the present invention. It is a signal NPN bipolar transistor comprising a emitter electrode 161, a base electrode 162, a $N^+$-type emitter region 163, a $P^-$-type base region 164, a $P^-$-type guard ring region 168, a $N^+$-type channel stopper region 169, a $N^-$-type collector region 165, and a $N^+$-type collector region 166. When high switching speed is required of the bipolar transistor, the question is how to reduce the time to turn off, T off, specifically the time that excessive minor carriers in the base region 164 is stored, Tstg. If a base-width WB 167 is narrowed, Tstg is reduced. However, if so, a safe working region (ASO) of the transistor also becomes narrow. FIG. 16 is a graph showing a relation between WB and Tstg. Tstg of the inventive transistor irradiated an electron beam reduces by half in comparison with that of a transistor which is not irradiated any beam.

Figure 17:
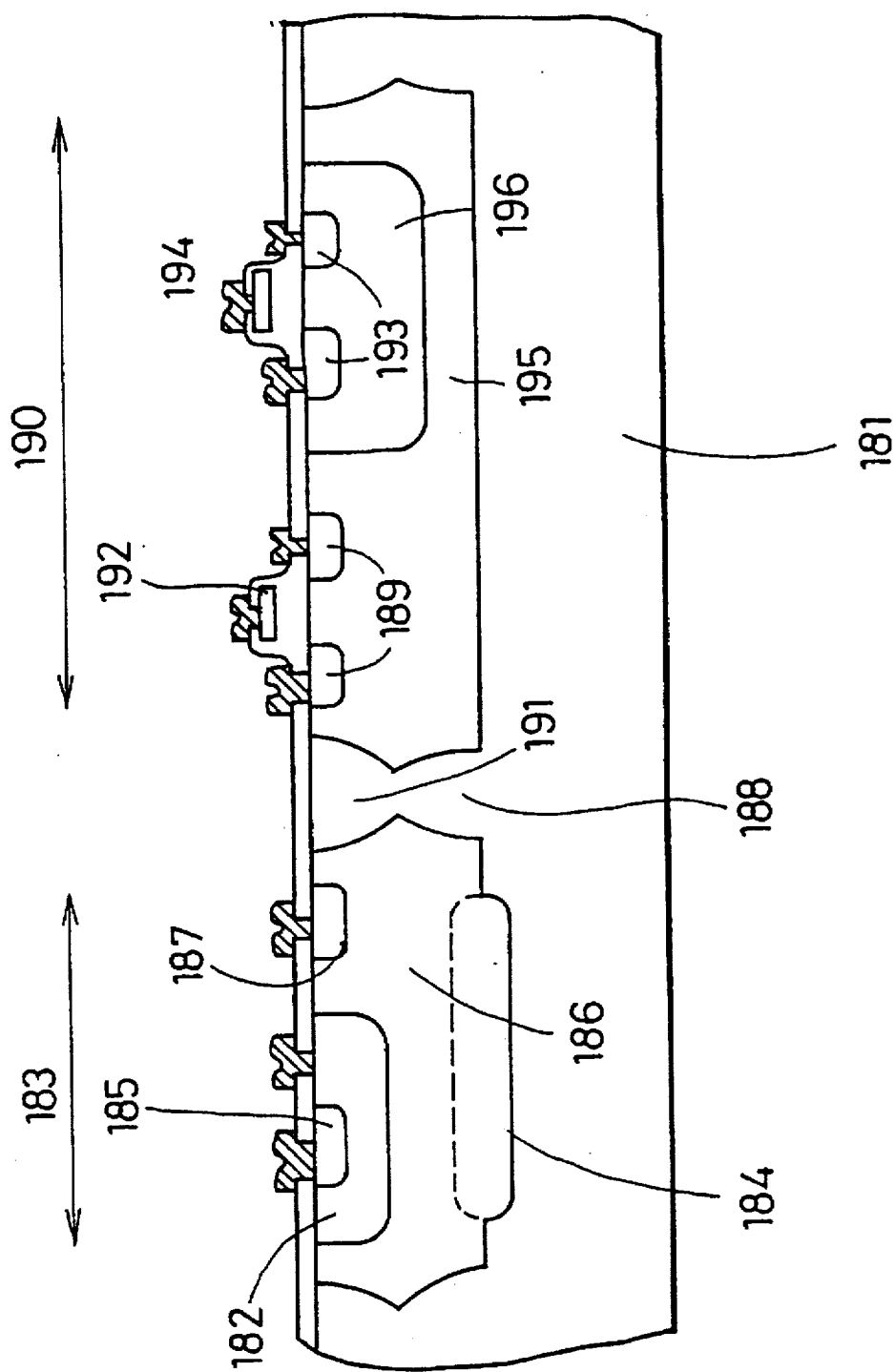
FIG. 17 is a schematic cross section showing a part of a semiconductor integrated circuit device which is a fourth embodiment of a semiconductor device disclosed in the present invention.

FIG. 17 is a schematic cross section showing a part of a semiconductor integrated circuit device which is a fourth embodiment of a semiconductor device disclosed in the present invention. It is a BiCMOS-type semiconductor integrated circuit device in which the bipolar elements and the CMOS elements are intermingled. As described above, by applying the present invention, both good latch-up resistance in a CMOS portion 190 and good switching speed in a bipolar portion 183 can be obtained. The NPN bipolar portion 183 comprises a $N^+$-type emitter region 185, a $P^-$-type base region 182, and $N^+$-type collector regions 184, 186, and 187, wherein each of the regions has an electrode.

The CMOS portion 190 comprises a P-channel MOS transistor provided on the surface of a $N^-$-type region 195 and a N-channel MOS transistor provided on the surface of a $P^-$-type region 196. The P-channel transistor includes a $P^+$-type impurity region 189 functioning as a source/drain region and a gate electrode 192. The N-channel MOS transistor includes a $N^+$-type impurity region 193 functioning as a source/drain region and a gate electrode 194.

ADVANTAGEOUS EFFECTS OF THE INVENTION

As mentioned above, in the present invention, in an airtight container which is evacuated at over 1 E-2 Torr (high degree of vacuum), an electron beam of over 2 MeV and 1 E15/cm² is irradiated to a wafer and then annealing is performed at over 200° C. to the wafer for more than one hour. As a result, at 150 K., shallow level traps of which the activation energy from valence band EV is under 0.1 eV and which are produced at a concentration of about 1.2–1.7 E15/cm³ and deep level traps of which the activation energy is about 0.28–0.32 eV and which are provided at a concentration of about 1.6–2.0 E13/cm³ are obtained. Then a semiconductor substrate having both the above-stated levels functioning as recombination centers in a band gap of silicon is obtained. Therefore, by employing the above-stated semiconductor substrate, latch-up resistance improves because minority-carrier lifetime is low and furthermore good leakage current of pn-type junction and MOS transistor characteristic are obtained. The chip size does not increase and the cost is low as an epi wafer is not used. As well, it is possible to manufacture a semiconductor integrated circuit device after evaluating its electrical characteristic.

What is claimed is:

1. A semiconductor device having crystal defects of which an activation energy is 0.28–0.32 eV at 150 K. in a monocrystal silicon semiconductor region at a concentration of $1.6 \times 10^{13} – 2.0 \times 10^{13}$ cm$^{-3}$.

2. A semiconductor device as claimed in claim 1, wherein crystal defects of which an activation energy is under 0.1 eV at 150 K. are produced at a concentration of $1.2 \times 10^{15}$cm$^-$3–$1.7 \times 10^{15}$ cm$^{-3}$.

3. A semiconductor device as claimed in claim 1, wherein a complementary type insulating gate field effect transistor circuit comprising a N-type insulating gate field effect transistor and a P-type insulating gate field effect transistor is placed at said monocrystal silicon semiconductor region.

4. A semiconductor device as claimed in claim 1, wherein a plurality of photo sensors are disposed at predetermined intervals in said monocrystal silicon semiconductor region.

5. A semiconductor device as claimed in claim 1 comprising a base region of first conductive type which is constituted of a part of said monocrystal silicon semiconductor region, an emitter region and a collector region of second conductive type which are constituted of a silicon semiconductor region and which are provided so as to be adjacent to said base region.

\* \* \* \* \*